(12) United States Patent
Caradonna et al.

(10) Patent No.: US 10,139,449 B2
(45) Date of Patent: Nov. 27, 2018

(54) AUTOMATIC TEST SYSTEM WITH FOCUSED TEST HARDWARE

(71) Applicant: Teradyne, Inc., North Reading, MA (US)

(72) Inventors: Michael A. Caradonna, Santa Clara, CA (US); Daniel A. Derringer, San Jose, CA (US); Stephen R. Wilkinson, Gilroy, CA (US)

(73) Assignee: Teradyne, Inc., North Reading, MA (US)

( * ) Notice: Subject to any disclaimer, the term of this patent is extended or adjusted under 35 U.S.C. 154(b) by 137 days.

(21) Appl. No.: 15/006,977

(22) Filed: Jan. 26, 2016

(65) Prior Publication Data

US 2017/0212164 A1 Jul. 27, 2017

(51) Int. Cl.
| | | |
|---|---|---|
| *H01L 21/00* | (2006.01) | |
| *G01R 31/319* | (2006.01) | |
| *G06F 1/00* | (2006.01) | |
| *G01R 31/28* | (2006.01) | |

(52) U.S. Cl.
CPC ... *G01R 31/31905* (2013.01); *G01R 31/2889* (2013.01); *G01R 31/31926* (2013.01); *G01R 31/2874* (2013.01); *G06F 1/00* (2013.01); *H01L 21/00* (2013.01); *H01L 2221/00* (2013.01)

(58) Field of Classification Search
CPC ....... H01L 21/00; H01L 2221/00; H04L 1/00; H04L 2201/00; G06F 1/00; G06F 2101/00
See application file for complete search history.

(56) References Cited

U.S. PATENT DOCUMENTS

| | | |
|---|---|---|
| 4,777,452 A | 10/1988 | Hayami et al. |
| 5,155,451 A | 10/1992 | Gladden et al. |
| 5,257,354 A | 10/1993 | Comfort et al. |

(Continued)

FOREIGN PATENT DOCUMENTS

| | | |
|---|---|---|
| JP | 2010-107507 A | 5/2010 |
| JP | 2010-252126 A2 | 11/2010 |
| KR | 2010-0634992 B1 | 10/2006 |

OTHER PUBLICATIONS

International Search Report and Written Opinion for Application No. PCT/US2014/011036 dated Apr. 25, 2014.

(Continued)

*Primary Examiner* — Jermele M Hollington
*Assistant Examiner* — Temilade Rhodes-Vivour
(74) *Attorney, Agent, or Firm* — Wolf, Greenfield & Sacks, P.C.

(57) ABSTRACT

A tester interface unit comprising a test hardware module. The test hardware module may have a simple construction, relying on control and/or signal processing in one or more tester instruments to generate or analyze test signals for a device under test. The test hardware module may be disposed within the tester interface unit, providing a short and high integrity signal path length to the device under test. The tester interface unit may include a purge gas chamber and a cooling chamber, with the hardware module penetrate a separator between those chambers, sealing an opening between the purge gas chamber and the cooling chamber. A heat spreader may move heat generated on the portion of the test hardware module in the purge gas chamber to the cooling chamber.

27 Claims, 9 Drawing Sheets

(56) References Cited

U.S. PATENT DOCUMENTS

| | | | |
|---|---|---|---|
| 5,646,968 A | 7/1997 | Kovacs et al. | |
| 5,854,797 A * | 12/1998 | Schwartz | G01R 31/3191 |
| | | | 714/724 |
| 6,055,644 A | 4/2000 | Henkel | |
| 6,154,071 A | 11/2000 | Nogawa | |
| 6,330,664 B1 | 12/2001 | Halvarsson | |
| 6,396,313 B1 | 5/2002 | Sheen | |
| 6,405,333 B1 * | 6/2002 | Sopkin | G01R 31/3193 |
| | | | 714/724 |
| 6,531,903 B1 | 3/2003 | Wichman | |
| 6,976,183 B2 | 12/2005 | Gage et al. | |
| 7,064,616 B2 | 6/2006 | Reichert | |
| 7,319,936 B2 | 1/2008 | Reichert | |
| 7,336,748 B2 | 2/2008 | Messier | |
| 7,356,111 B1 | 4/2008 | Dean | |
| 7,379,395 B2 | 5/2008 | Gage et al. | |
| 7,454,681 B2 | 11/2008 | Reichert et al. | |
| 7,769,559 B2 | 8/2010 | Reichert | |
| 9,134,377 B2 | 9/2015 | Champion et al. | |
| 2002/0186031 A1 * | 12/2002 | Pelissier | G05D 23/2401 |
| | | | 324/750.03 |
| 2004/0190331 A1 * | 9/2004 | Ross | G11C 29/1201 |
| | | | 365/154 |
| 2004/0247006 A1 | 12/2004 | Choi et al. | |
| 2006/0034408 A1 | 2/2006 | Lin | |
| 2006/0095221 A1 | 5/2006 | Salmi et al. | |
| 2006/0150041 A1 | 7/2006 | Yacobucci | |
| 2006/0176525 A1 | 8/2006 | Mizuta et al. | |
| 2007/0086253 A1 * | 4/2007 | Gerowitz | G11C 29/32 |
| | | | 365/201 |
| 2008/0082886 A1 | 4/2008 | Rasmussen et al. | |
| 2008/0088333 A1 * | 4/2008 | Chun | G01R 31/31712 |
| | | | 324/762.05 |
| 2008/0089152 A1 * | 4/2008 | Ozeki | G11C 29/50 |
| | | | 365/201 |
| 2008/0235539 A1 | 9/2008 | Yamada | |
| 2009/0224793 A1 * | 9/2009 | Kemmerling | G01R 31/318307 |
| | | | 324/750.15 |
| 2012/0182031 A1 * | 7/2012 | Tokumoto | G01R 31/2621 |
| | | | 324/750.01 |
| 2013/0135011 A1 | 5/2013 | Chen et al. | |
| 2013/0200917 A1 * | 8/2013 | Panagas | G01R 1/0441 |
| | | | 324/757.01 |
| 2014/0253099 A1 * | 9/2014 | Han | G01R 19/00 |
| | | | 324/126 |
| 2014/0281776 A1 | 9/2014 | Champion et al. | |
| 2015/0063133 A1 * | 3/2015 | Olgaard | H04W 24/08 |
| | | | 370/252 |
| 2016/0006441 A1 | 1/2016 | Van der Wagt et al. | |

OTHER PUBLICATIONS

International Search Report and Written Opinion for Application No. PCT/US2015/036914 dated Sep. 30, 2015.
[No Author Listed] Magnum V: Ultra-High Performance FLASH and DRAM Memories Test Solution. Available at: http://www.teradyne.com/products/semiconductor-test/magnum-v. Last accessed May 25, 2016.

* cited by examiner

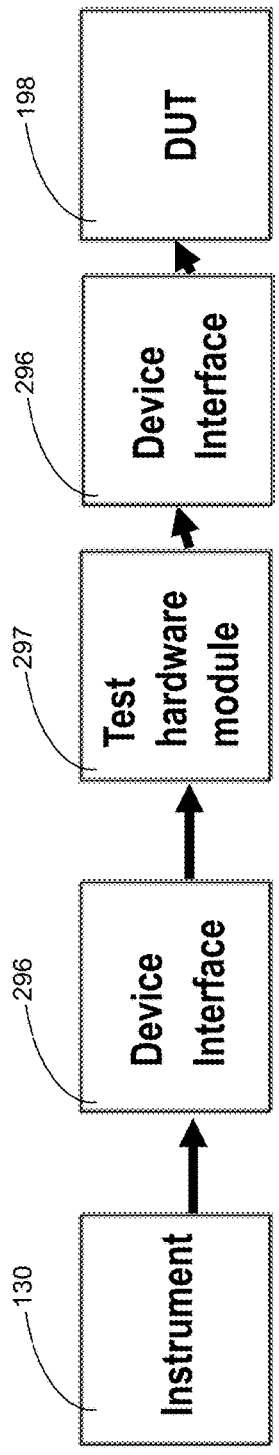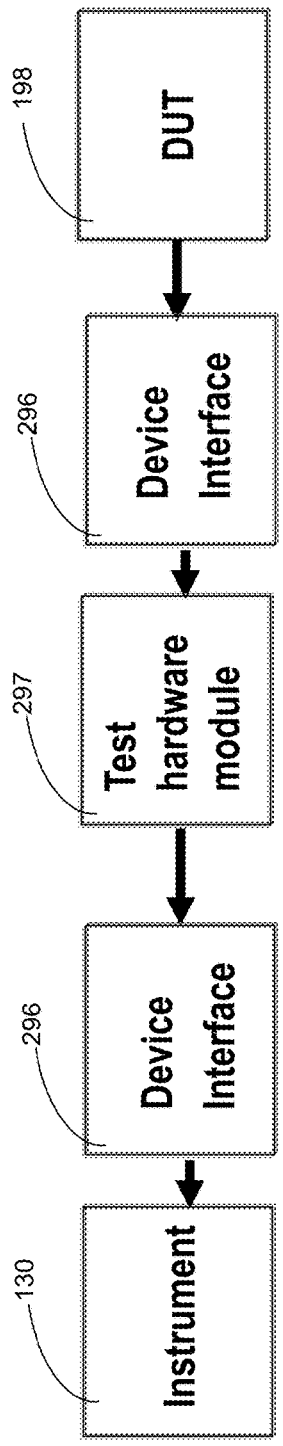

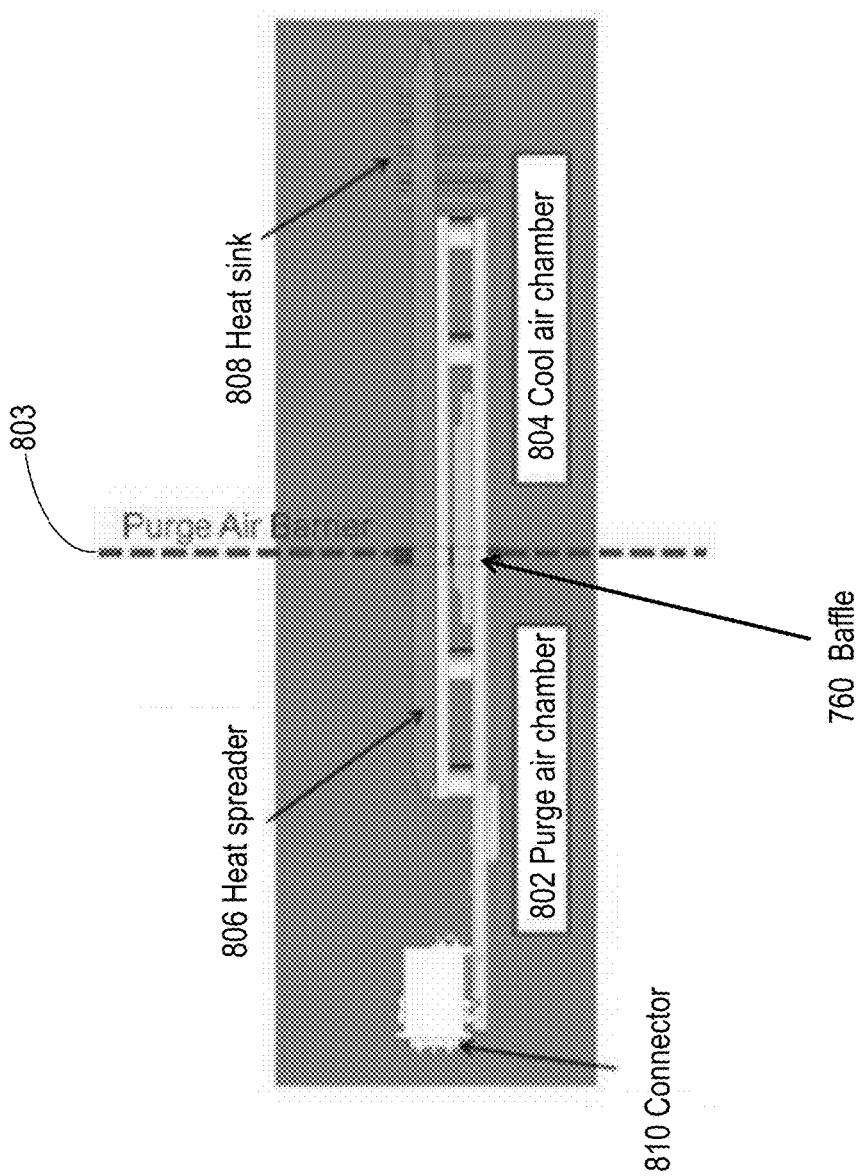

AUTOMATIC TEST SYSTEM WITH FOCUSED TEST HARDWARE

BACKGROUND

Prior to being incorporated into consumer products, electronic devices, such as integrated circuit chips, are subjected to a variety of electrical tests designed to determine whether they operate properly. Sophisticated methods to assess the integrity of electronic devices use automation to quickly perform the desired analyses. For integrated circuits, the tests may be executed on the devices while still part of a semiconductor wafer on which the device is manufactured or on the device after is packaged. Testing may influence the manufacturing steps performed on a specific device, with some devices being discarded or, where devices are manufactured with redundant circuitry that can be used to replace faulty circuitry, routed to a rework station for repair. In some manufacturing operations, based on the results of testing, a device may be "binned", with devices that operate, but below specifications, being binned for labeling and sale as reduced functionality parts.

Tests often comprise a wide variety of analyses, whether in the analog or digital domain. For example, the following analyses may be performed: open/short circuit test, bit error rate test, address line test, data line test, random number sequence, random moving inversion, and jitter analysis. Combinations of these analyses may determine whether the overall device under test (DUT) operates properly, and, if not, may identify the defective portions of the DUT. In addition to being useful for binning parts, the information obtained through the analyses may be used to improve manufacturing yields.

To meet the throughput needed for economic manufacture of semiconductor devices, tests are typically performed on a large number of units in parallel. A piece of automatic test equipment, referred to as a "tester," may be used to generate test signals that stimulate multiple DUTs and to measure the responses. The tester may determine whether each DUT is operating properly by comparing the response evoked to a carefully controlled test pattern with an expected response.

To test DUTs completely, the tester should generate and measure signals such as may be found in the operating environment of those DUTs. Test equipment is typically made with multiple instruments. Each instrument may perform a specific function, such as generating high speed digital signals or producing an analog waveform that has a programmed characteristic. Multiple instruments are installed in a tester to provide the combination of analog and digital signals needed to test a particular device. Creating instruments that provide separate test functions provides a flexible way to configure a test system to generate and measure a set of test signals required for testing any of a wide variety of semiconductor devices.

Though the functions of a test system may be configured by the selection of instruments installed in the test system, the inputs and outputs points of these instruments are arrayed in a known pattern, which is unlikely to match the connections on devices to be tested. A tester interface unit (TIU) may be used to connect the input and output points on the tester to one or more devices under test. The TIU may be constructed with a tester interface and a device interface, with signal-carrying conductors running between them. The tester interface may provide connections that are aligned with the inputs and the outputs of the tester. The device interface may have sockets, probe needles or other structures to make contact to the devices under test. The signal carrying conductors may be cables or other flexible conductors, enabling a "space transformation" between the device interface and the tester interface, such that the configuration of contact points at the device under test can be independent of the configuration of contact points at the test system. The cables also provide for high signal integrity, which is necessary to test high performance devices.

In some instances, an interface between a test system and a device under test may be implemented with a device interface board (DIB). A DIB may be one or a stack of printed circuit boards, which is likely to provide lower signal integrity than a TIU. In some instances, custom test circuitry may be mounted on the printed circuit board used as a DIB. This approach may be used, for example, when a function needed to fully test a DUT is not sufficiently common to design an instrument in a test system that performs this function. Accordingly, the custom circuitry on the DIB is self-contained, with any hardware necessary for generating and measuring test signals and controlling that hardware to perform the test function.

SUMMARY

Some aspects of the present application relate to a method of testing at least one electronic device under test using a test hardware module in conjunction with a test system. The method may comprise sourcing control signals with at least one instrument of the test system; routing the control signals to the test hardware module through a device interface; with the test hardware module, generating and delivering test signals, based on the control signals, through the device interface to the at least one electronic device under test; routing a response to the test signals from the at least one electronic device under test to an instrument of the at least one instrument; and determining the outcome of the test with the instrument of the at least one instrument.

Further aspects of the present application relate to a tester interface unit for use in conjunction with an automated test system for performing a test on at least one electronic device under test, the test system comprising at least one instrument that sources and receives signals. The tester interface unit may comprise a device interface comprising a plurality of connection points configured to form electrical connections with the at least one electronic device under test; a tester interface comprising a plurality of connection points configured to form electrical connections with the at least one instrument of the test system; conductive interconnects configured to convey electrical signals between the device interface and the tester interface; a separable test hardware module, in electrical communication with the device interface. The test hardware module may comprise at least one control input coupled via the device interface to a connection point on the tester interface; at least one test signal port coupled via the device interface to a connection point of the plurality of connection points on the device interface; and electronic circuitry that, responsive to signals received through the at least one control input, generates or measures at least one test signal at the test signal port.

Additional aspects of the present application relate to a test hardware module for use in conjunction with an automated test system for performing a test on at least one electronic device under test coupled to a device interface, the test system comprising at least one instrument that sources and receives signals. The test hardware module may comprise electronic circuitry comprising a control input and a test signal point, the electronic circuitry being configured to generate or measure at least one test signal at the test signal point based on a signal at the control input; and a separable electrical connector configured to form a plurality of electrical connections to a corresponding connector on the device interface, the electrical connector being electrically connected to the control input and the test signal point of the electronic circuitry.

The foregoing is a non-limiting summary of the invention, which is defined only by the appended claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 3A is a signal flow diagram illustrating a signal path from a test instrument to a device under test, according to some non-limiting embodiments;

FIG. 3B is a signal flow diagram illustrating a signal path from a device under test to a test instrument, according to some non-limiting embodiments;

FIG. 8 is a side view of test hardware module configured for installation with a first portion in a purge gas chamber and a second portion in a cool air chamber, according to some non-limiting embodiments.

DETAILED DESCRIPTION

Figure 1A:
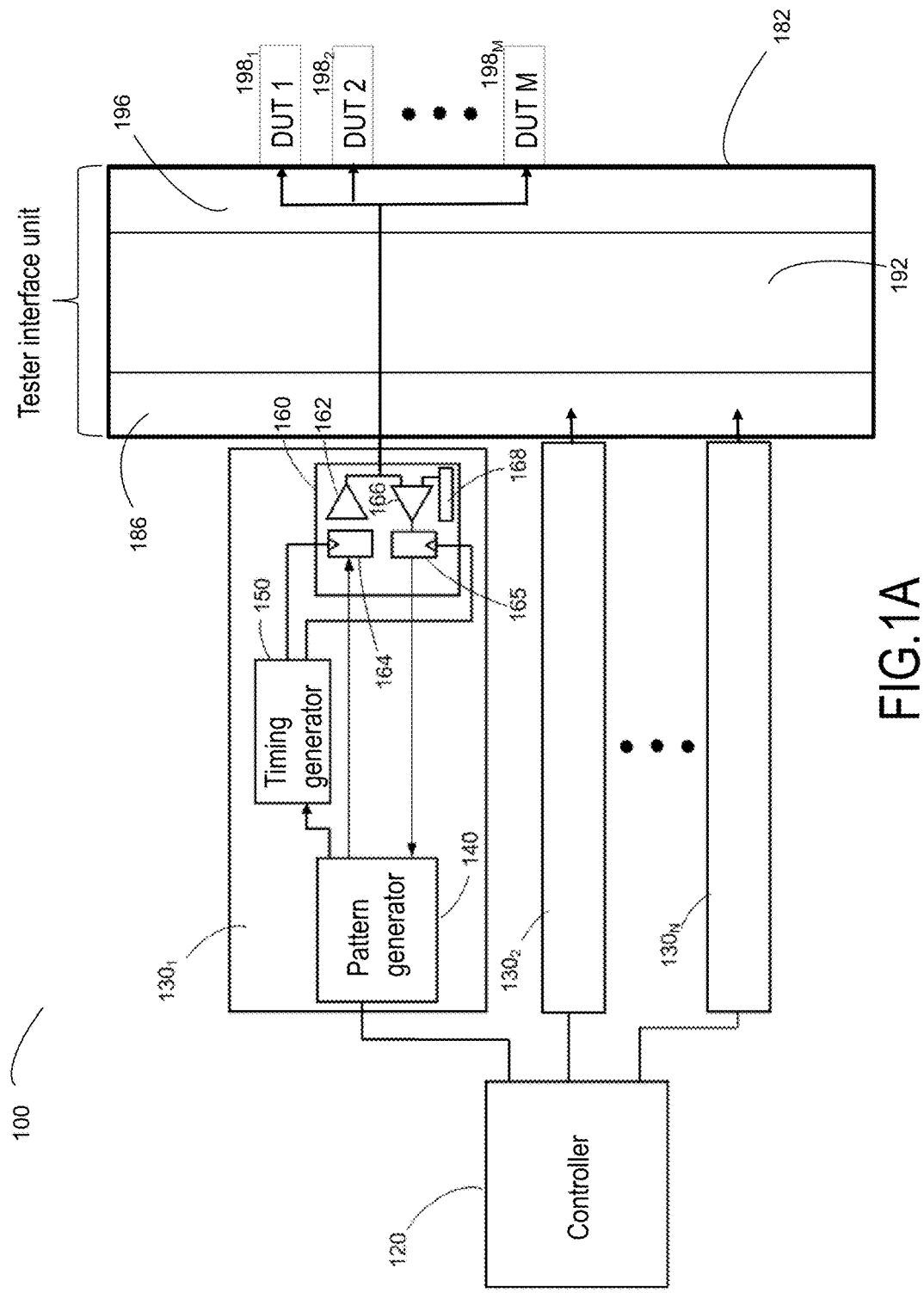
FIG. 1A is a block diagram of a system suitable for testing a device using a tester interface unit.

The inventors have recognized and appreciated that the cost and lead time associated with the test of electronic devices using automatic test equipment may be greatly reduced by introducing test hardware in a tester interface unit (TIU). That test hardware may interact with instruments in the tester, which may provide control functions for the test hardware and/or analyze signals measured with the test hardware. By utilizing capability on existing instruments, the test hardware may be focused on only the components that need to be added to support a desired test function. As a result, the test hardware may be quickly developed at relatively low cost.

In some embodiments, the test hardware may be modular, with signal and power connectors that enable installation in a TIU. The device interface portion of the TIU may be configured with separable connections through which a test hardware module may be connected to the TIU. Connection through the device interface provides a short, high integrity signal path to the DUT. In addition, it provides a mechanism to supply power and control signals from instruments in the test system to the test hardware module, without requiring dedicated connections from the test system to the test hardware module. Avoiding dedicated connections increases the overall flexibility of the test system by enabling instrument connections to the tester interface to route, in some instances, signals to or from an instrument directly to a DUT or, in other instances, to a test hardware module. Accordingly, the TIU, and the entire test system may be used in some scenarios without the test hardware installed or, in other scenarios with the test hardware installed to provide additional capability.

Such an approach may be used in applications that require ad hoc functionalities to be included within the automatic test equipment. Using conventional test system architectures, such requirements might dictate the development of additional instruments and interfaces. Such development may require significant engineering investments due to the complexity of the test instruments.

However, using techniques as described herein, a test hardware module may be introduced within the TIU to, in combination with test instruments designed for other test functions, provide the desired test functions. The test hardware module may leverage the resources existing within the automatic test equipment, thus simplifying design and implementation of the test hardware module. The use of test hardware modules of the type described herein may reduce the need for complex instruments and consequently may reduce development costs and lead times.

The inventors have further recognized and appreciated that the performance of test equipment may be greatly improved by shortening the signal path length between the circuitry sourcing test signals and the DUT. Most test instruments are bulky and are placed within test heads in such a way that long cables are needed to deliver test signals to the DUT. The use of cables limits the maximum data rate that can be carried without incurring significant signal deterioration.

A test hardware module of the type described herein may be disposed within the TIU at a distance from the DUT that is significantly shorter than the minimum signal path length imposed by current TIUs. Consequently, TIUs comprising such dedicated hardware may be used to perform tests requiring data rates of several Gb/s. For example, current TIUs may be limited to perform tests with data rates of 1.6 Gb/s or less. TIUs comprising dedicated hardware of the type described herein may enable tests with data rates up to 12 Gb/s in some embodiments, up to 14 Gb/s in some embodiments, up to 16 Gb/s in some embodiments, up to 18 Gb/s in some embodiments, up to 20 Gb/s in some embodiments, up to 22 Gb/s in some embodiments, up to 24 Gb/s in some embodiments.

Following below are more detailed descriptions of various concepts related to, and embodiments of, methods and apparatus associated with a tester interface unit comprising one or more test hardware modules. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1A is a block diagram of a system suitable for testing a device using a tester interface unit that may be used in connection with embodiments of the invention. In particular, FIG. 1A illustrates test system 100 that comprises controller 120 which controls instruments $130_1$, $130_2$, ... $130_N$ to, for each cycle, generate signals for, or measure signals from, devices under test (DUT) $198_1, 198_2, \ldots 198_M$. It will be appreciated that N may take any suitable value depending on the needs of the testing system and M may take any suitable value depending on the degree of parallelism enabled by test system 100. In some embodiments, test system 100 is an automated test system.

In some embodiments, the DUTs may be digital memory chips, and a test system may test dozens or possibly hundreds of such devices in parallel. In the case of a memory test system, instruments $130_1, 130_2, \ldots 130_N$ may be digital instruments, each being configured to generate digital signals to test one or multiple memory chips at a time, with multiple instruments being provided to test the numerous memory devices to be tested concurrently. In other embodiments, the DUTs may be system on chip (SoC) or other devices that operate on analog signals alone or in conjunction with digital signals. In that case, there may be multiple types of instruments, including RF signal generators and waveform generators, designed to test operating characteristics of SoC. Though, even in scenarios in which the DUTs operate on only digital signals, analog signals or measurements may be used in testing those DUTs, such as to test power consumption, leakage current or other operating parameters. It should be appreciated that the specific nature of the instruments and of the DUTs being tested is not critical to the invention.

Instruments $130_1, 130_2, \ldots 130_N$ may send and receive test signals to or from the DUTs via tester interface unit (TIU) 182. As will be described further below, the TIU 182 may comprise a tester interface 186, a space transformation portion 192 and a device interface 196. In some embodiments, TIU 182 may route test signals between an instrument and the DUTs, depending on the needs of the test being performed.

An automated test system may include, in addition to instruments, components to control the instruments such that the instruments may operate together to test the DUTs and process the results. These components may include components that execute test programs, sending appropriate control signals to individual instruments and provide timing information and signals to synchronize the instruments. In the simplified example of FIG. 1A, these control components are shown schematically as controller 120.

Controller 120 may include, for example, a computer programmed to direct the testing process carried out by test system 100. Such an exemplary controller may further collect and/or process data during tests and may provide an interface to an operator.

In some embodiments, instruments $130_1, 130_2, \ldots 130_N$ may include circuits to perform basic electronic test functions such as voltmeters, ohmmeters, digitizers, digital I/Os, power supplies, signal generators, pulse generators, digital pattern generators, arbitrary waveform generators, and any suitable combination thereof.

Tests may be automated and parallelized by providing a set of instructions to controller 120. The tests may be configured to verify whether a particular component operates as expected and/or to identify the defective parts. In some embodiments the DUTs may comprise integrated circuits and test system 100 may be configured to test a plurality of DUTs in parallel, with the testing performed on packaged parts. In such embodiments, a handler may be used to automatically place the DUTs in the TIU. The handler may be controller by controller 120. In other embodiments the DUTs may comprise entire, or portions of, wafers. In such embodiments, a prober may be used to probe circuitry integrated within the wafer under test.

Test system 100 may perform any one or more of a wide variety of analyses, whether in the analog or digital domain, including but not limited to open/short test, bit error rate test, address line test, data line test, random number sequence, random moving inversion, and jitter analysis.

In the non-limiting example of FIG. 1A, instrument $130_1$ is shown in additional detail, and may represent a digital test instrument. Instrument $130_1$ comprises pattern generator 140, timing generator 150 and pin electronics 160. Pattern generator 140 may execute one vector of a test pattern during each cycle of the test system. For example, a vector in the test pattern may define an operation that causes the instrument to interact with DUT $198_1$. Such interaction may include driving one or more test signals to one or more test points on DUT $198_1$, and/or receiving one or more test signals from one or more test points on DUT $198_1$. An automatic test system, such as test system 100, programmed with a test pattern may store the test pattern in any suitable location such that the pattern generator is able to retrieve and execute vectors from the test pattern. As a non-limiting example, the test pattern may be stored in a memory located within system 100, e.g., within pattern generator 140.

Timing generator 150 may create timing signals that control the transitions between test signals. For example, timing generator 150 may define the start time when a test signal begins to be provided to DUT $198_1$, or the time at which a test signal provided from DUT $198_1$ should be measured.

Pin electronics 160 may provide an interface for test signals sent to and received from the DUTs via TIU 182. In particular, pin electronics 160 may comprise drive circuitry that provides test signals to one or more test points on the DUTs, and may comprise detection circuitry that receives test signals from one or more test points on the DUTs. The drive circuitry may comprise driver 162 and flip-flop 164. Flip-flop 164 may be clocked by a timing signal provided by timing generator 150 and may be supplied with data from pattern generator 140. Thereby, flip-flop 164 is able to control the particular test signal output by driver 162 and the time at which it is output.

Pin electronics 160 may also detect test signals from the DUTs through comparator 166. The comparator may receive test signal(s) provided from one or more test points on the DUTs in addition to a reference value provided by programmable reference value generator 168. Comparator 166 may determine whether received test signal(s) match a specified value, or a range of specified values, provided from the programmable reference value generator 168. For example, comparator 166 may be used to determine whether test signals received from the DUTs match the expected results of the test being performed, and may provide a high or low value based on whether a test signal is above or below an expected value. Latch 165 may be clocked by timing generator 150.

In the example illustrated, instrument $130_1$ is shown with pin electronics having a single driver and a single comparator, suitable for interfacing to a single test point on a device under test. This configuration is shown for simplicity. It should be appreciated that, in some embodiments there may be more than one driver or comparator for a test point. Additionally, pin electronics may include circuitry to generate or measure test signals for more than one test point. The example of FIG. 1A is provided as a non-limiting example of providing test signals to, and receiving test signals from, one or more devices under test using a test system. However, any suitable implementation of an automatic test system may be used as the invention is not limited in this respect.

Instruments $130_2, \ldots 130_N$ shown in FIG. 1A may be digital instruments, like instrument $130_1$, or may be any other suitable type of instrument generating and/or measuring any suitable type of signal. Regardless of the nature of the instruments, inputs and/or outputs of the instruments may be connected to a tester interface unit 182. In the illustrated embodiment, tester interface unit 182 provides both a mechanical and an electrical interface to multiple DUTs to be tested. Tester interface unit 182 includes a tester interface 186, connected to the tester, a device interface, to which multiple DUTs are connected, and a space transformer that connects the tester interface to the device interface.

Figure 1B:
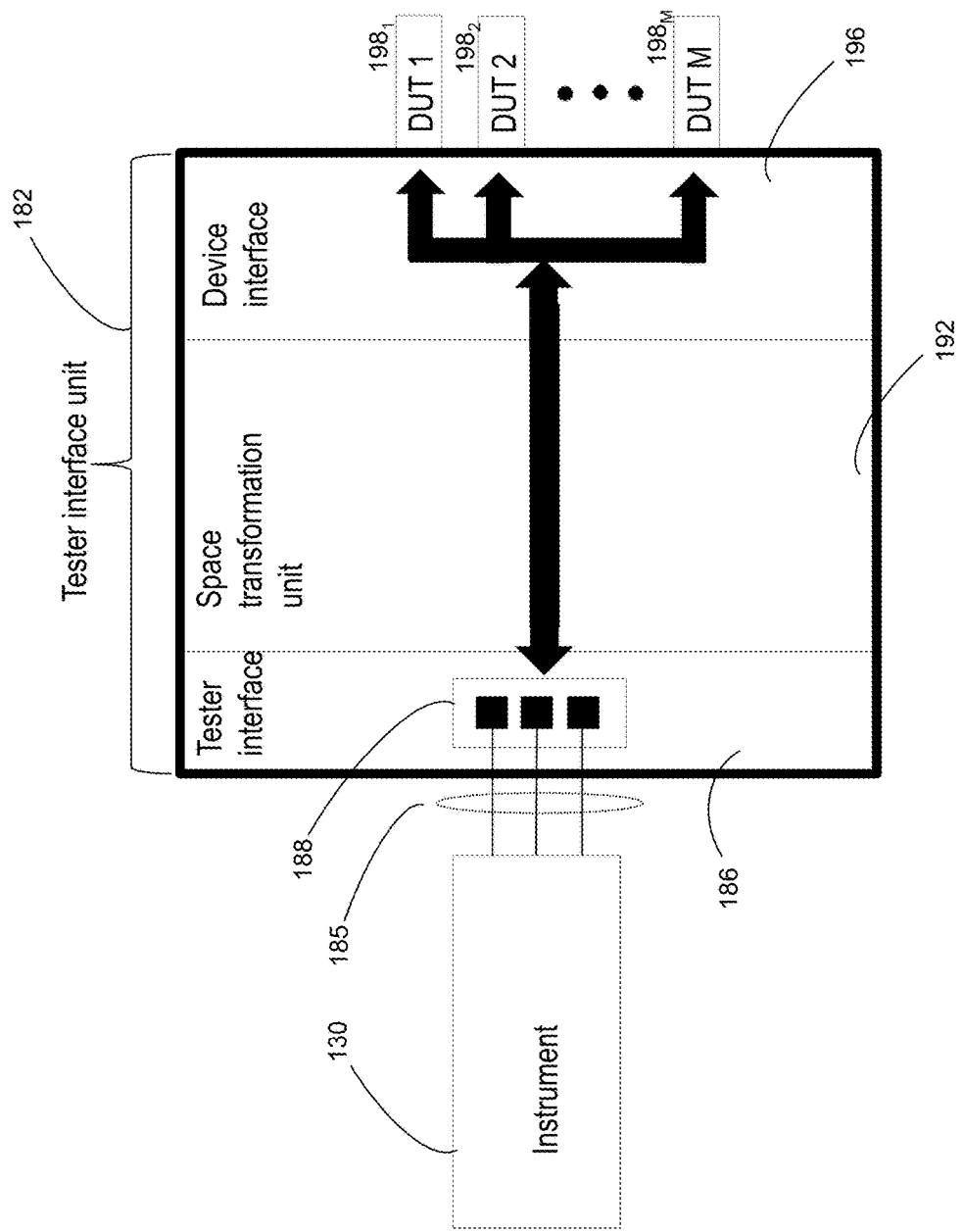
FIG. 1B is a block diagram of a tester interface unit.

FIG. 1B illustrates TIU 182 in additional detail, according to some current techniques. TIU 182 may comprise tester interface 186, configured to receive test signals, generated by instrument 130, and delivered through connectors 185. Instrument 130 may be any of the instruments $130_1$, $130_2, \ldots 130_N$ shown in FIG. 1A. The test signals may be analog and/or digital. For example, the test signals may be generated by pattern generator 140 shown in FIG. 1A. Tester interface 186 may comprise a substrate that may support multiple connection points 188. The substrate may be a printed circuit board and the connection points may be pads, coaxial connectors or other suitable cable attachment mechanisms. Those connections may be made on one side of the printed circuit board. Pads on the other side of the printed circuit board may be connected to input/output points on the tester, such as through an interposer. Alternatively or additionally, the substrate may be a plate-like structure made of metal or other suitably rigid material. Cables terminated for connection to signal inputs or outputs on the tester may be attached to the substrate. In other embodiments, the substrate may hold connectors that may be connected to the cables and other connectors that make contact with the tester. In some embodiments, zero-insertion force (ZIF) connectors may be used to connect tester interface 186 to instrument 130.

TIU 182 may further comprise space transformation portion 192. Space transformation portion 192 routes test signals between tester interface 186 and DUTs connected to device interface 196. In the embodiment illustrated, tester interface unit 182 is configured for testing packaged parts. In such an embodiment, device interface 196 may comprise one or more sockets to accommodate the DUTs $198_1$, $198_2 \ldots 198_N$. Device interface 196 may be specific to the DUT and/or the handler (not shown) being used. A handler may be used to automatically place the DUTs on the device interface, or on any suitable location on the TIU.

Space transformation portion 192 may be used to rearrange the test signals delivered to the TIU through standard connectors to positions that align with connection points on the device interface. Accordingly, space transformation portion 192 may comprise a plurality of conductive interconnects, which may be flexible. Those interconnects may be implemented with cable assemblies, and may include connectors or similar components that aid in making electrical connection.

Figure 2:
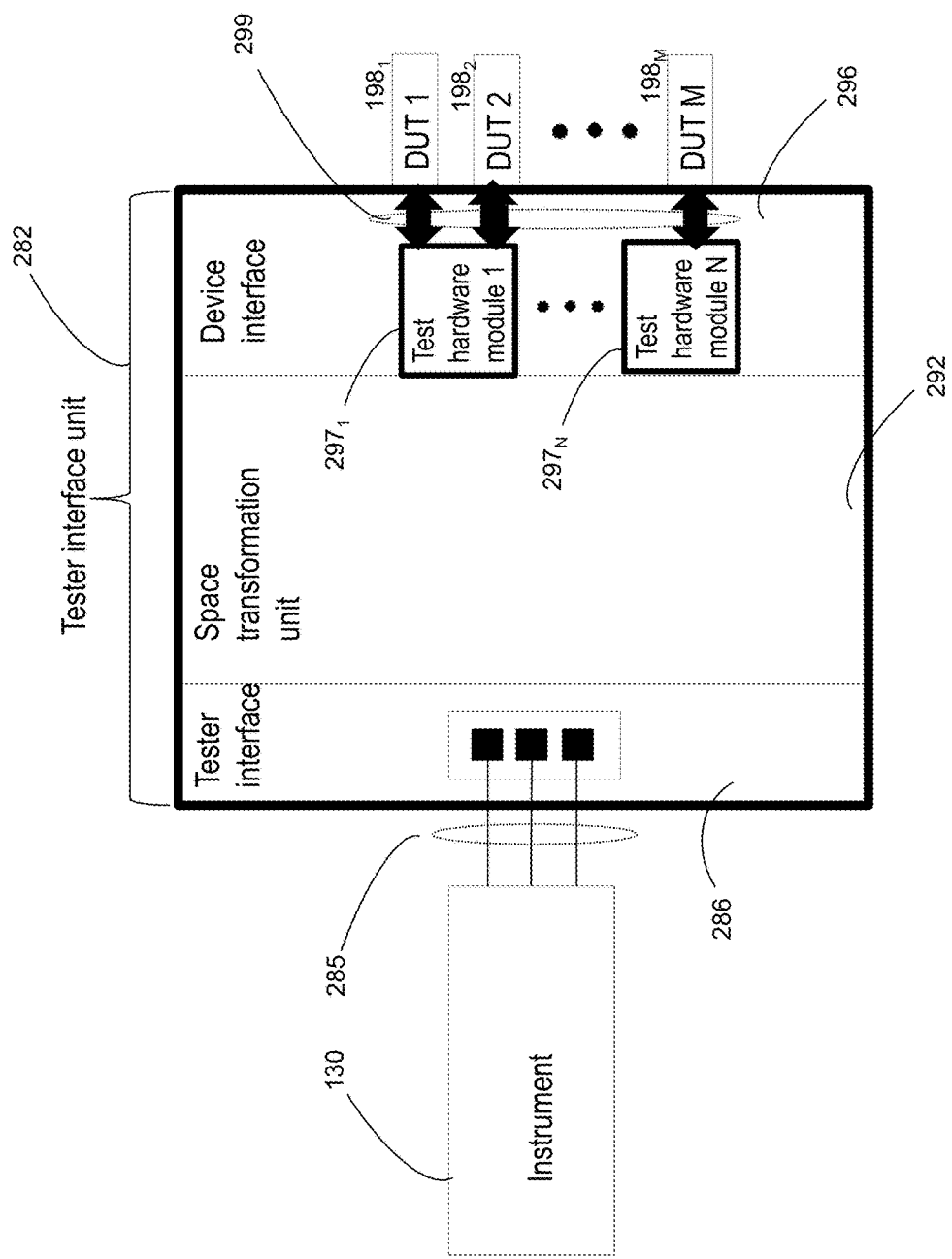
FIG. 2 is a block diagram of a tester interface unit comprising at least one test hardware module, according to some non-limiting embodiments.

FIG. 2 is a block diagram of a tester interface unit comprising at least one test hardware module, according to some non-limiting embodiments. Similarly to TIU 182, TIU 282 may comprise tester interface 286, space transformation portion 292 and device interface 296. In addition, TIU 282 may comprise one or more test hardware modules $297_1, \ldots 297_N$, where N may assume any suitable value equal to, or greater, than 1 or, in some embodiments or configurations, may not be present at all. In some embodiments, device interface 296 may have separable connectors configured to receive corresponding connectors on test hardware modules $297_1, \ldots 297_N$, such that, in some scenarios, one or more test hardware modules may be installed and in other scenarios, different or no test hardware modules may be installed.

Test hardware modules $297_1, \ldots 297_N$ may perform any suitable signal generation and measurement functions, including those that could be performed by an instrument installed in a tester. In some embodiments, test hardware modules $297_1 \ldots 297_N$ may be configured to generate or measure very high speed signals. Such test hardware, for example, might implement test functions on signals that would undergo an undesirable degree of distortion passing through TIU 282. By generating or measuring those signals in a module attached to device interface 296, that distortion may be avoided or eliminated. For example, test hardware modules $297_1 \ldots 297_N$ may generate high frequency clock signals. Alternatively or additionally, test hardware modules $297_1 \ldots 297_N$ may perform test functions that are not performed frequently enough to warrant the design and implementation of an instrument to perform those test functions.

As yet a further alternative, test hardware modules $297_1 \ldots 297_N$ may be used when there is a need to deploy a test system with test functions sooner or at lower cost than would be possible by designing an instrument to implement those test functions. To support rapid and low cost deployment, a test hardware module may have a simple construction in comparison to an instrument. Such an implementation may be achieved with a test hardware module that is controlled by an instrument. For example, a digital instrument as described above may be programmed and connected to a test hardware module such that the digital signals generated by the instrument, rather than being applied to a device under test, may be routed to the test hardware module as control signals. Such control signals may be routed to the tester interface through connectors 285, and be delivered to the test hardware modules through the space transformation unit. Test hardware modules $297_1, \ldots 297_N$ may comprise circuitry to respond to the control signals generated by instrument 130.

In some embodiments, control signals may be routed to test hardware module through device interface 296. Such a configuration allows instrument 130 to be connected to test hardware modules using mechanisms conventionally used to interface instrument 130 to a DUT. Accordingly, no changes, other than programming the nature of signals generated or measured, are required to instrument 130. As a result, instrument 130 may, in some instances, generate or measure test signals at a DUT while, in other instances, control or process data from a test hardware module. In some embodiments, an instrument may perform both of these functions, such as by multiplexing inputs or outputs of instrument 130 between connection points on device interface 296 that are connected to a DUT and connection points that are connected to a test hardware module. Alternatively or additionally, if the instrument 130 contains sufficient resources, it may simultaneously generate or measure test signals at a DUT or control a test hardware module to generate or measure signals at a DUT.

A test hardware module may perform any suitable functions in response to such control signals. In some embodiments, test hardware modules $297_1 \ldots 297_N$ may generate test signals to be delivered to the DUTs $198_1, 198_2 \ldots 198_N$, in response to the control signals. The test signals may be delivered to the DUTs through signal paths 299. The control signals may specify the format, timing or other aspects of the test signals. In some embodiments, the test hardware module may be designed to perform specific functions and the signal generated by the test hardware module may have characteristics that cannot be matched by signals generated by an instrument within the tester, such as instrument 130. These characteristics may include data rate, voltage level, phase stability or any other suitable characteristic.

Alternatively or additionally, test hardware modules $297_1 \ldots 297_N$ may make measurements or perform other signal processing functions as specified by the control signals. As with generated signals, the signal processing functions, in some embodiments, will be functions that instruments within the tester are not able to perform or perform in the same way. For example, test hardware may be customized to perform one or a small number of functions and may perform those functions at a higher rate than circuitry in an instrument.

Test hardware modules $297_1, \ldots 297_N$ may be implemented with any suitable circuitry that responds to such control signals. In some embodiments, test hardware modules $297_1, \ldots 297_N$ may comprise one or more application-specific integrated circuits (ASICs), field-programmable gate arrays (FPGAs) or any suitable programmable circuitry. In addition, test hardware modules $297_1, \ldots 297_N$ may comprise one or more memory devices.

Each test hardware module may deliver test signals to one or a plurality of DUTs. Routing of signals from a specific test hardware module to a specific DUT may be controlled by circuitry within device interface. In the example shown in FIG. 2, test hardware module $297_1$ is configured to deliver test signals to two DUTs. However, the present application is not limited in this respect. In fact, each test hardware module may deliver test signals to any suitable number of DUTs, whether in series or simultaneously. If a test hardware module is to deliver different test points sequentially, the test hardware module, or device interface, may include switching circuitry that enables changing connections between the test hardware module and the DUTs.

Compared to the TIU of FIG. 1B, the signal path associated with the test signals can be significantly shortened due to the fact that the test signals are generated within the TIU and close to the DUTs. In some embodiments the test hardware modules may be mounted on the device interface 282 so as to provide a short signal path, such as signal path 299. However, the test hardware modulus may be mounted in any suitable location within the TIU. In some embodiments, the length of the signal path associated with the test signals may be less than 10", less than 5", less than 2" or less than 1".

In some embodiments, the test hardware modules may be configured to receive one or more responses from the DUTs, generated in response to the test signals provided. Such response(s) may be delivered to the test hardware modules through signal paths 299. In some embodiments, such response(s) may be routed to instrument 130 via device interface 296, space transformation unit 292, connectors 285, or any suitable combination thereof.

In some non-limiting embodiments, the DUTs shown in FIG. 2 may comprise memory chips. In some embodiments, the memory chips may comprise multimedia card (MMC) memories, secure digital (SD) memories, universal flash storage (UFS) memories or any suitable combination thereof. However the current application is not limited to memory chips and any other suitable type of electronic device may be tested with the TIU shown in FIG. 2.

As an example, a TIU of the type described herein may be used to test UFS memory chips having a serializer/deserializer (SerDes) interface. In some non-limiting embodiments a control signal may exhibit data rates that are less than 2 Gb/s. This data rate may also represent the maximum data rate of test signals that can be generated by an instrument within the tester. However, testing a serializer/deserializer (SerDes) interface may require higher data rate signals. Accordingly, test signals may exhibit data rates between 6 Gb/s and 12 Gb/s. Test signals may be formatted to enable test hardware module to perform bit error rate tests or perform any other suitable type of test.

FIG. 3A is a signal flow diagram illustrating a signal path from a test instrument to a device under test, according to some non-limiting embodiments. Instrument 130 may source one or more control signals configured to control the operation of a test hardware module 297. The control signals may be routed to device interface 296 through tester interface 286 and space transformation portion 292. Device interface 296 may deliver the control signals to test hardware module 297 connected to device interface 296. In response to the control signals sourced by instrument 130, test hardware module 297 may generate test signals configured to test DUT 198. The test signals may be provided to DUT 198 through device interface 296.

FIG. 3B is a signal flow diagram illustrating a signal path from a device under test to a test instrument, according to some non-limiting embodiments. Signals from DUT 198 may be routed back to test hardware module 297 via device interface 296. These signals may be responsive to test signals from test hardware module 297, instrument 130 or generated in any other suitable way. Test hardware module 297 may process such responses and generate an output signal that may be delivered to instrument 130 via device interface 296, space transformation portion 292 and tester interface 286. Based on the signals received, instrument 130 may determine the outcome of the test or provide a further output that may be processed by other components within the tester to determine a test result.

It should be appreciated that test hardware module may generate, measure or process signals or any suitable portion of the signals used in performing a test. Other functions that implement the rest of the test may be implemented by other components in the test system. In some embodiments, for example, the response to the test signals from the test hardware module may be routed directly to instrument 130 via device interface 296, space transformation portion 292 and tester interface 286. Alternatively, the test signals to stimulate a DUT may be generated in whole or in part by instrument 130 and the response signals may be processed within a test hardware module. As yet a further example, a test hardware module may generate a signal, such as a clock of a particular frequency or phase or a data signal with a particular pattern, that is used in conjunction with signals from instrument 130.

Figure 4:
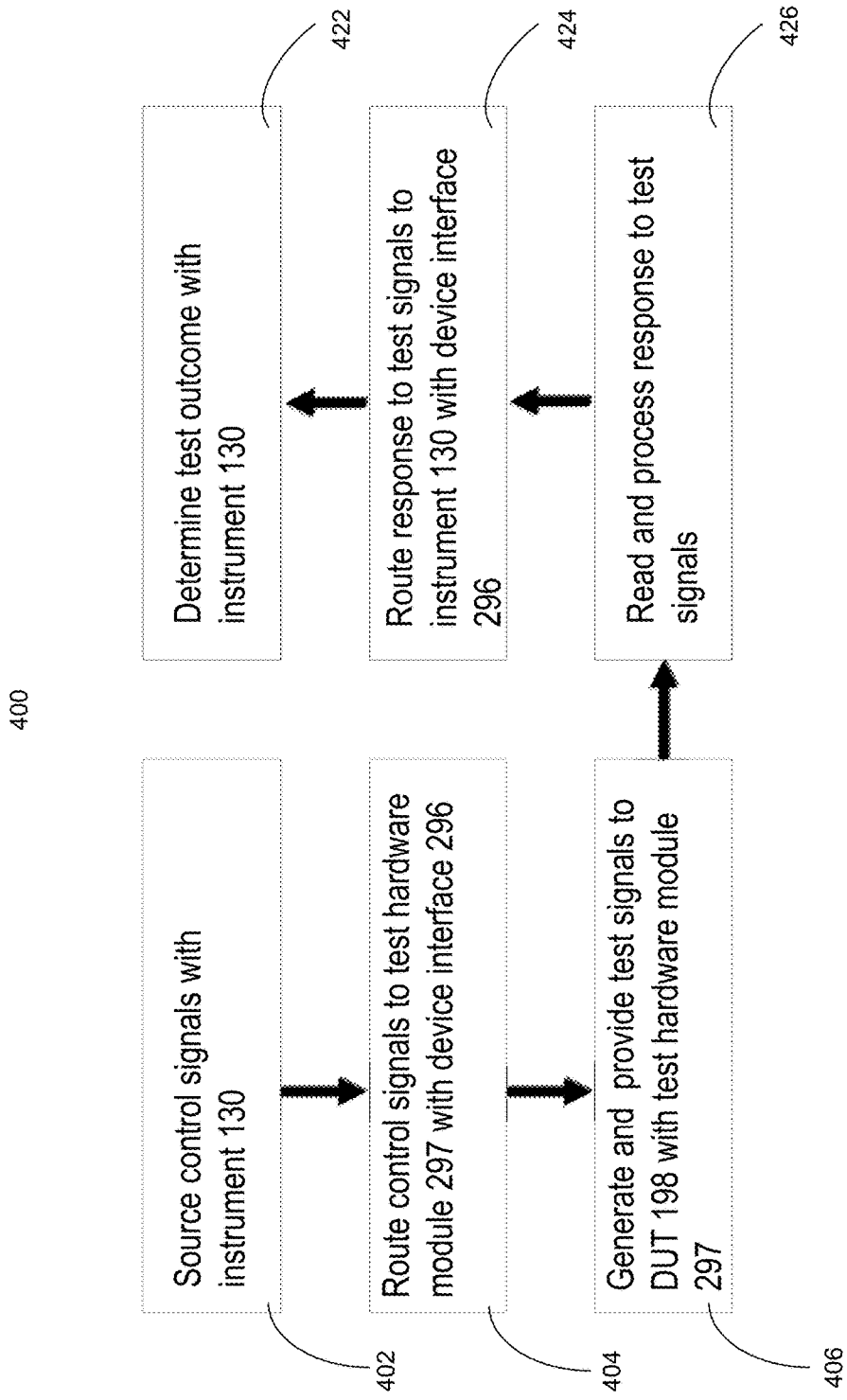
FIG. 4 is a flow chart illustrating steps of a method to test a device using at least one test hardware module, according to some non-limiting embodiments.

FIG. 4 is a flow chart illustrating steps of a method to test a device using at least one test hardware module, according to some non-limiting embodiments. Method 400 may be used in connection with the embodiment of FIG. 2. In act 402, control signals may be sourced by instrument 130. The control signals may be analog or digital and may be configured to control the operations of test hardware module 297. In act 404, the control signals may be routed to test hardware module 297 via device interface 296. In act 406, test signals may be generated by test hardware module 297 in response to the control signals. The test signals may be provided to DUT 198 via device interface 296 through signal paths 299. In act 426, the response to the test signals may be routed by device interface 296 to instrument 130. In some embodiments, the response to the test signals may be routed directly to instrument 130. In other embodiments, the response to the test signals may be routed to test hardware module 297. Test hardware module 297 may process such response, and the processed signals may be routed to instrument 130 via device interface 296 at act 424. At act 422, instrument 130 may determine the outcome of the test based on the DUT's response.

In some embodiments, the test hardware module may utilize resources existing in known tester interface units. As one example, power may be provided to the test hardware module through the device interface. In some embodiments, the device interface may comprise or be connected to a power supply capable of delivering a power large enough to enable the test hardware module's operations. In some embodiments, power may be provided to the test hardware module through a power supply located outside the device interface.

Power connections between a test hard module and a device interface may, as with signal connections, be made through separable connectors. Such separable connections may allow different test hardware modules to be installed in a test system at different times to configure the test system to test different devices or perform different types of tests on the same type of device. Alternatively, the test system may be operated with no test hardware module installed. In some embodiments, power may be delivered through the same connectors that couple signals between the test hardware module and device interface.

Figure 5:
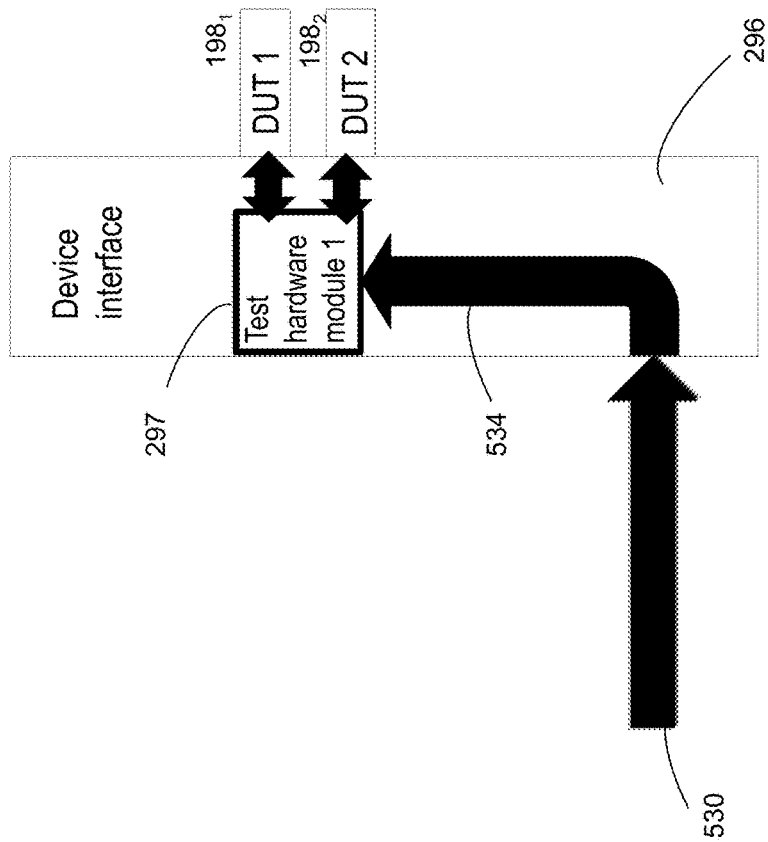
FIG. 5 is a power flow diagram, illustrating power flow to the test hardware module through the device interface, according to some non-limiting embodiments.

FIG. 5 is a power flow diagram, illustrating power flow to the test hardware module through the device interface, according to some non-limiting embodiments. FIG. 5 depicts a system comprising a device interface 296, a test hardware module 297 and DUTs 198$_1$ and 198$_2$, where power is supplied to the test hardware module 297 through the device interface, according to some non-limiting embodiments. Power may be first delivered to the device interface 296 as indicated by arrow 530. For example, power may be supplied through other components of the TIU, the test head, the test instrument, the support cabinet, or by a power supply residing in any suitable location within test system 100. In some embodiments, the source of power used to power DUTs during a test may be used to power the test hardware module. Power may then be provided to test hardware module 297 via device interface 296, as indicated by arrow 534.

In some non-limiting embodiments, power may be delivered to device interface 296 through spring pins. The spring pin may take the form of a slender cylinder containing, spring-loaded pins. When pressed between the device interface and the tester interface unit, sharp points at each end of the spring pin may create secure contacts with the two components, thus electrically connecting them together. Spring pins may be arranged in dense arrays, connecting together many individual nodes of the one or more device interfaces being used.

Figure 6:
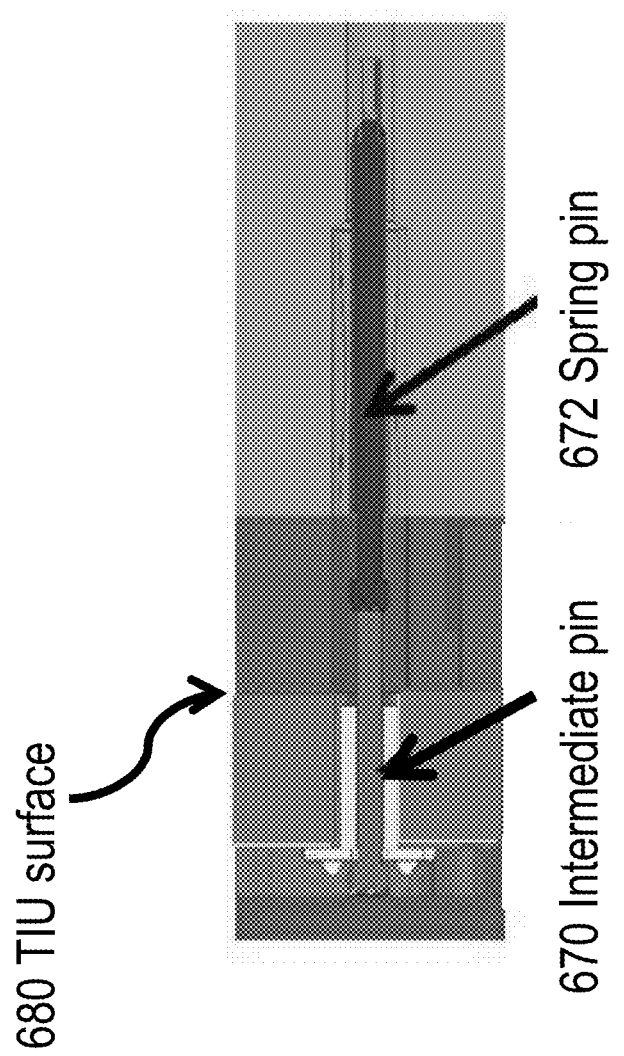
FIG. 6 is a schematic cross-section of connection between a device interface and test interface unit, showing an electrical connector used to supply power to the device interface, according to some non-limiting embodiments.

FIG. 6 is a schematic cross-section of connection between a device interface and test interface unit, showing an electrical connector used to supply power to the device interface, according to some non-limiting embodiments. FIG. 6 illustrates a spring pin used to supply power to the device interface. Spring pin 672 may be buried in the tester interface unit and may be recessed from the TIU surface 680. Because the spring pin does not stick outside the tester interface unit, the spring pins are protected from accidental damage. In addition, the tester interface unit may be used in combination with a device interface that does not comprise a test hardware module and therefore does not require auxiliary power. In such embodiment, the spring pin may be recessed inside the TIU thus not limiting the positioning of the device interface.

Such power connections may provide power to supply to a test hardware module. The device interface may be mated with the tester interface unit through an intermediate pin 670 that is part of the device interface. Intermediate pin 670 may contact spring pin 672 thus providing an electrical connection. In some embodiments, the power delivered to the device interface may be up to 80 W, which may adequate to supply power for testing DUTs and test hardware modules. However, any suitable amount of power may be delivered to the device interface.

Figure 7:
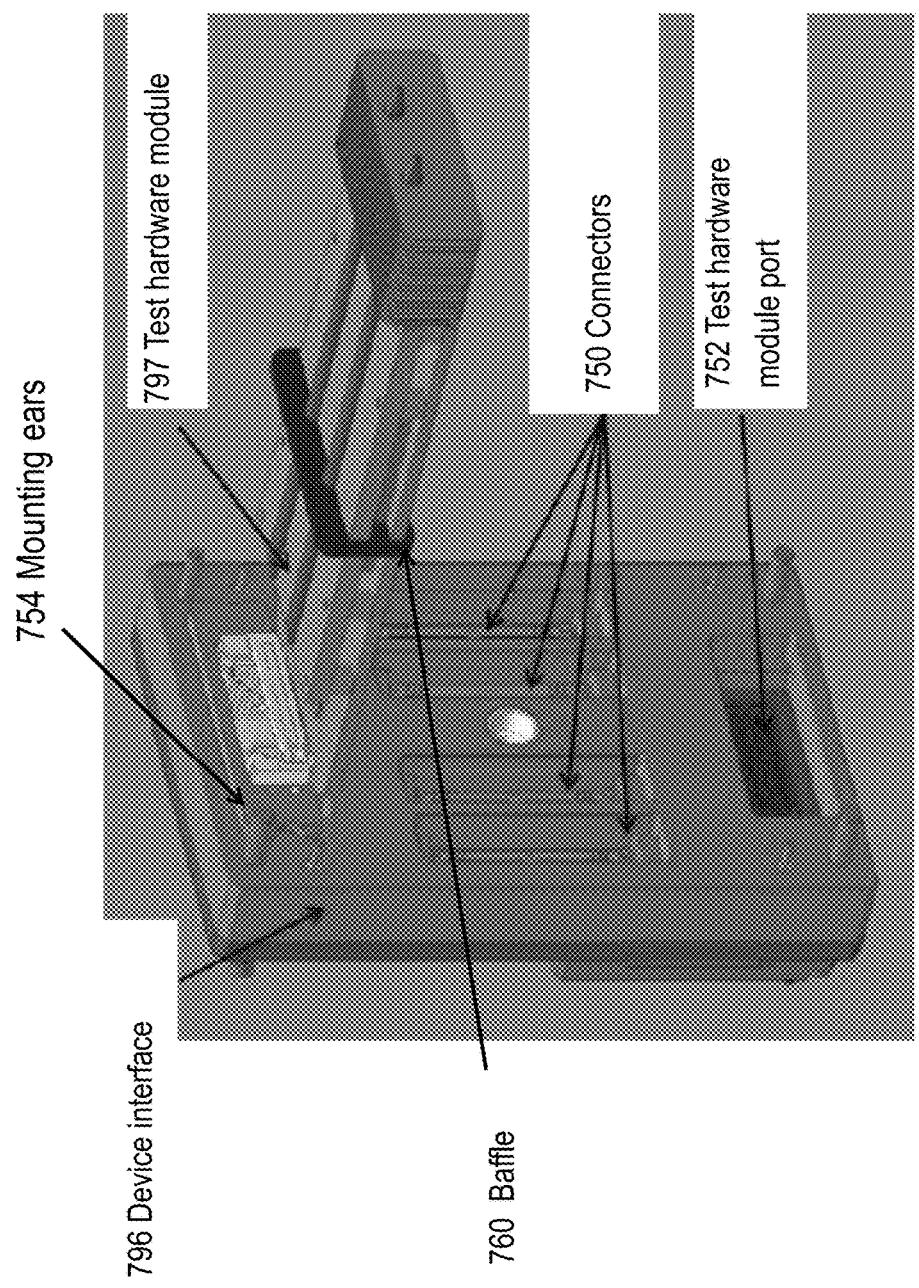
FIG. 7 is a perspective view of a test hardware module mounted to a device interface, according to some non-limiting embodiments.

FIG. 7 is a perspective view of a test hardware module mounted to a device interface, according to some non-limiting embodiments. Device interface 796 may be formed with a substrate with a tester-facing side, which is visible in FIG. 7. An opposing surface (not visible in FIG. 7) may have contact points, such as chip sockets, configured to make contact to one or more DUTs. That opposing surface may face a handler when in operation. Accordingly, the surface of device interface 796 visible in FIG. 7 may face space transformation portion 292 (FIG. 2) of a TIU 282 (FIG. 2).

The substrate of device interface 796 may be any suitable material. In some embodiments the substrate may be a printed circuit board, containing multiple conductive traces that route signals between connectors on the tester-facing side and sockets on the opposing surface. Connectors 750 on the tester-facing side may receive cables connected to instruments within the tester. These connectors may be implemented and perform functions as known in the art. Additionally, some connectors may be added to interface to test hardware modules. The connectors that interface to test hardware modules may be high speed connectors as are known in the art, and may be the same or different than the connectors used to connect cables from tester instruments to device interface 796.

As can be appreciated from FIG. 7, test hardware module 797 may be attached directly to device interface 796, in order to limit the length of the signal paths 299. As shown, that connection is made by mating a connector on test module 797 with a connector on device interface 796. As a specific example, test hardware module 797 may be connected to device interface 796 through pin field arrays such as Samtec SEAM or SEAF interconnects. However the present application is not limited to these types of connections and any other suitable connector may be used. The electric connection may be used to deliver signals to, and from, the test hardware module as well as to supply power to the test hardware module.

Test hardware module 797 may comprise at least one control input configured to receive control signals from instrument 130 via tester interface 286 and device interface 796. Test hardware module 797 may comprise at least one test signal port coupled to a connection point on one of the DUTs via device interface 796. The at least one signal port may be configured to provide test signals to the DUT(s) and/or to receive a response from the DUT(s). In some embodiments, test hardware module 797 may comprise at least one output configured to transmit such response to instrument 130 via tester interface 286 and device interface 796.

Device interface 796 may comprise one or more additional ports to attach additional test hardware modules. Any suitable number of additional test hardware modules may be attached to device interface 796. For example, device interface 796 shown in FIG. 7 has one additional test hardware module port 752.

In some embodiments, test hardware module 797 may be mounted on device interface 796 through mounting ears 754, as illustrated in FIG. 7. The mounting ears may comprise one or more brackets having an angle of approximately 90°. Such angle may be between 80° and 100° in some embodiments. Mounting ears 754 may allow for test hardware module 797 to be fixed to device interface 796 through one side. The side of test hardware module 797 that is opposite the fixed side may be suspended in some embodiments.

As both the test hardware module and instruments are connected to device interface 796, the instruments may be connected to the test hardware module as well as provide and measure test signals at the DUTs. As a result, processing power of an instrument may be used in conjunction with test functions performed by a test hardware module. The test hardware module can thus be made compact enough that multiple such modules may fit within the test interface unit. In some non-limiting embodiments, the test hardware module may have a surface having a length that is less than 7" and a width that is less than 2". However, the size of the test hardware module is not limited to such implementation.

In some embodiments, the test hardware module is configured with components so that it may be adjacent the device interface without degrading performance of the test system or increasing its cost. These components may include a baffle, such as baffle 760, heat conveyance mechanism and/or heat sink. These components may enable testing of DUTs at low temperatures. Semiconductor devices are often tested at multiple temperatures, as temperature variations can change performance of the device such that defects may only be detected when tested at low temperatures.

In some embodiments, tests are performed at low temperatures by cooling the device interface. In some embodiments, tests may be performed at temperatures between approximately −20° C. and −30° C., between approximately −30° C. and −40° C., between approximately −40° C. and −50° C. However, such cooling may cause frost or ice to form on the device interface, or otherwise cause moisture to condense, including inside the tester interface unit. In embodiments in which test hardware modules are mount to the device interface, at least a portion of the test hardware module will be adjacent the device interface and may therefore be exposed to condensation.

Condensed moisture may accelerate corrosion and thus shorten the useful life of the equipment. To prevent the formation of condensed moisture during low temperature tests, purge gas may be employed. In some embodiments, the purge gas is a dry gas, such as pressurized air or nitrogen. Purge gas may be supplied into the tester interface unit, where condensation is undesirable.

In some embodiments, the test hardware modules could be fully immersed in the purge gas. However, the inventors have recognized and appreciated a design that could provide lower cost testing.

A test hardware module will generate heat in operation. The amount of heat generated may be large enough that some form of active cooling would be useful. If purge gas is used, the purge gas flowing over the test hardware module could be used to cool the test hardware modules. However, preparing purge gas can be relatively expensive. Confining purge gas into a finite volume, and not relying on the purge gas to carry heat away from a test hardware module, reduces the amount of purge gas used for a test and may reduce the cost of the test. To confine the purge gas, a purge gas chamber may be formed. The purge gas may flow through that purge chamber at a sufficient rate that purge gas that becomes more humid is removed and reconditioned to remove moisture. The flow rate required to remove moisture may be less than required to remove heat, such that relying on the purge gas for cooling would require that more purge gas be used. For example, the ratio of flow rate required to remove heat to flow rate required to remove moisture may be less than 10 in some embodiments, between 10 and 100 in some embodiments, or more than 100 in some embodiments.

To limit the amount of heat from a test hardware module carried away by the purge gas, a separate cooling chamber may be formed, and the test hardware module may be configured so that heat from operation of the test hardware module is released in the cooling chamber. Such a result may be achieved by configuring the test hardware module such that a portion is in the purge gas chamber and another portion is in the cooling chamber. Components of the test hardware module that generate heat may be positioned on the portion that is in the cooling chamber. Alternatively or additionally, a heat conveyance mechanism may be used to move heat from the purge chamber to the cooling chamber.

In some embodiments, the purge gas may be purge air and the cooling chamber may carry away heat using cooling air. The purge chamber and cooling chamber may be separated by ducting, baffles or other suitable components that limits mixing of purge air and cooling air.

FIG. 8 is a side view of test hardware module configured for installation with a first portion in a purge gas chamber and a second portion in a cool air chamber, according to some non-limiting embodiments. Purge gas chamber 802 may be located on the device interface side and the cool air chamber 804 may be located opposite the device interface. Purge air barrier 803 may be used to separate the two chambers. The air barrier may have an opening through which the test hardware module is inserted. Test hardware module may include baffle 760 to seal the opening, thus preventing the cool air from spilling into the purge air chamber and vice versa. In some embodiments the baffle may be made of an elastomer. However, any other suitable material may be used.

In some embodiments, components of the test hardware module may be located close to the device interface, which may position those components within the purge air chamber. Heat generated by those components may be transferred from the purge air chamber to the cool air chamber through a heat transfer component, such as heat spreader 806 and/or a heat pipe configured to enhance thermal conduction. These components may transfer heat according to any suitable mechanism, such as conduction (if made of a material with high heat conductivity, such as graphite) or evaporation (if shaped to allow evaporation at the hot end and condensation at the cold end in a closed loop system) or fluid flow, (if shaped with fluid flow channels that allow cooling fluid to flow through the component).

In some embodiments, the heat transfer component may be coupled to a heat sink or other component that enhances heat transfer from the heat transfer component to the cooling fluid within the cooling chamber. In the embodiment illustrated in FIG. 8, heat sink 808 may be positioned in the cool air chamber to dissipate heat out of the test hardware module. The heat sink may comprise a plurality of fins.

In other embodiments, for example when liquid cooling systems are employed, a cold plate may be disposed on the test hardware module to move liquid, and consequently heat, away from components of the test hardware module in the purge air chamber and towards the cooling chamber. FIG. 8 further illustrates connector 810, used to connect the test hardware module to a device interface.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Also, circuits and modules depicted and described may be reordered in any order, and signals may be provided to enable reordering accordingly.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in non-transitory computer-readable storage media in any suitable form. For simplicity of illustration, data structures may be shown to have fields that are related through location in the data structure. Such relationships may likewise be achieved by assigning storage for the fields with locations in a non-transitory computer-readable medium that convey relationship between the fields. However, any suitable mechanism may be used to establish relationships among information in fields of a data structure, including through the use of pointers, tags or other mechanisms that establish relationships among data elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The various methods or processes outlined herein may be implemented in any suitable hardware, such as one or more processors, Field Programmable Gate Arrays (FPGAs) or Application Specific Integrated Circuits (ASICs). Additionally, the various methods or processes outlined herein may be implemented in a combination of hardware and of software executable on one or more processors that employ any one of a variety of operating systems or platforms. For example, the various methods or processes may utilize software to create or limit a test pattern and then utilize hardware to perform testing using the test pattern. The various methods or processes may also utilize software to perform a portion of automated testing and hardware to perform the remainder of the automated testing. An example of one such approach is described above. However, any suitable combination of hardware and software may be employed to realize any of the embodiments discussed herein.

The invention claimed is:

1. A method of testing at least one electronic device under test using a test hardware module in conjunction with a test system, the method comprising acts of:
   sourcing control signals with at least one instrument of the test system;
   routing the control signals to the test hardware module through a device interface;
   with the test hardware module, generating and delivering test signals, based on the control signals, through the device interface to the at least one electronic device under test;
   routing a response to the test signals from the at least one electronic device under test to an instrument of the at least one instrument; and
   determining the outcome of the test with the instrument of the at least one instrument.

2. The method of claim 1 wherein:
   the electronic device is a memory chip.

3. The method of claim 1 wherein:
   the device interface supplies power to the test hardware module.

4. The method of claim 1, further comprising:
   with a handler, automatically placing the electronic device under test in the device interface.

5. The method of claim 1, further comprising:
   cooling at least a portion of the test hardware module by transferring heat from a purge air chamber to a cooling air chamber and dissipating heat from the cooling air chamber.

6. A tester interface unit for use in conjunction with an automated test system for performing a test on at least one electronic device under test, the test system comprising at least one instrument that sources and receives signals, and the tester interface unit comprising:
   a device interface comprising a plurality of connection points configured to form electrical connections with the at least one electronic device under test;
   a tester interface comprising a plurality of connection points configured to form electrical connections with the at least one instrument of the test system;
   conductive interconnects configured to convey electrical signals between the device interface and the tester interface;
   a separable test hardware module, in electrical communication with the device interface, the test hardware module comprising:
   at least one control input coupled via the device interface to a connection point on the tester interface;
   at least one test signal port coupled via the device interface to a connection point of the plurality of connection points on the device interface; and
   electronic circuitry that, responsive to signals received through the at least one control input, generates or measures at least one test signal at the test signal port.

7. The tester interface unit of claim 6, wherein:
   the test hardware module is in electrical communication with the device interface unit through a separable, two-piece electrical connector.

8. The tester interface unit of claim 6, wherein:
   the electronic circuitry is further configured to process a measured test signal.

9. The tester interface unit of claim 6, wherein:
   the test hardware module has a power input; and
   the power input is connected to the device interface such that the test hardware module receives power through the device interface.

10. The tester interface unit of claim 6, further comprising:
    spring pins configured to supply power to the device interface.

11. The tester interface unit of claim 10, wherein:
    the spring pins are recessed from a surface of the tester interface.

12. The tester interface unit of claim 6, further comprising:
    a ZIF connector configured to form a separable connection between the tester interface unit to the at least one instrument.

13. The tester interface unit of claim 6, wherein:
    the tester interface unit comprises a cooling air chamber and a purge air chamber, and
    the test hardware module comprises a baffle positioned to form a seal between the cooling air chamber and the purge air chamber.

14. The tester interface unit of claim 6, wherein:
    the electronic circuitry of the test hardware module comprises at least one FPGA.

15. The tester interface unit of claim 6, wherein:
    the test hardware module has a rectangular surface has a length less than 7" and a width less than 2".

16. The tester interface unit of claim 6, in combination with the automated test system, wherein:
    an instrument of the at least one instrument is coupled to the tester interface unit so as to provide a control signal to a control input of the at least one control inputs through the device interface.

17. The tester interface unit in the combination of claim 16, wherein:
    the control signal is coupled through the device interface on a conducting path of less than 2 inches.

18. The tester interface unit in the combination of claim 16, wherein:
    the tester interface unit comprises a plurality of test hardware modules, the test hardware module being one of the plurality of test hardware modules; and
    one instrument of the at least one instrument is coupled to provide control signals to more than one of the plurality of test hardware modules.

19. A test hardware module for use in conjunction with an automated test system for performing a test on at least one electronic device under test coupled to a device interface, the test system comprising at least one instrument that sources and receives signals, and the test hardware module comprising:
    electronic circuitry comprising a control input configured to receive, via the device interface, a control signal sourced by the at least one instrument, and a test signal point, the electronic circuitry being configured to generate or measure at least one test signal at the test signal point based on the control signal received at the control input; and a separable electrical connector configured to form a plurality of electrical connections to a corresponding connector on the device interface, the electrical connector being electrically connected to the control input and the test signal point of the electronic circuitry.

20. The test hardware module of claim 19, wherein:
the separable electrical connector is a ZIF connector.

21. The test hardware module of claim 19, wherein:
the electronic circuitry comprises programmable circuitry programmed to perform a memory test function.

22. The test hardware module of claim 19, wherein:
the test hardware module comprises a first region and a second region;
the first region comprises the connector;
the test hardware module further comprises a heat conveying structure thermally connecting the first region to the second region.

23. The test hardware module of claim 22, further comprising:
a baffle separating the first region from the second region.

24. The test hardware module of claim 23, further comprising:
a heat sink in the second region.

25. The test hardware module of claim 24, wherein:
the heat sink comprises a plurality of fins.

26. The test hardware module of claim 24, wherein:
the heat sink comprises a water pipe.

27. The test hardware module of claim 22, wherein:
the heat conveying structure comprises a cold plate.

* * * * *